(12) United States Patent
Hsu et al.

(10) Patent No.: US 8,372,563 B2
(45) Date of Patent: Feb. 12, 2013

(54) MEMS LITHOGRAPHY MASK WITH IMPROVED TUNGSTEN DEPOSITION TOPOGRAPHY AND METHOD FOR THE SAME

(75) Inventors: Hsin-Hui Hsu, Hsin-Chu (TW);
Chuan-Wei Wang, Hsin-Chu (TW);
Sheng-Ta Lee, Hsin-Chu (TW);
Chih-Hung Lu, Hsin-Chu (TW)

(73) Assignee: Pixart Imaging Inc., Hsin-Chu (TW)

( * ) Notice: Subject to any disclaimer, the term of this patent is extended or adjusted under 35 U.S.C. 154(b) by 470 days.

(21) Appl. No.: 12/802,209

(22) Filed: Jun. 2, 2010

(65) Prior Publication Data
US 2011/0236805 A1    Sep. 29, 2011

(30) Foreign Application Priority Data

Mar. 29, 2010   (TW) ............................... 99109470 A

(51) Int. Cl.
*G03F 1/70*   (2012.01)
*G03F 7/00*   (2006.01)

(52) U.S. Cl. ............................................ 430/5; 430/325
(58) Field of Classification Search ............. 430/5, 325, 430/394
See application file for complete search history.

(56) References Cited

U.S. PATENT DOCUMENTS
2004/0018752 A1*   1/2004   Lee .................................. 439/43

\* cited by examiner

*Primary Examiner* — Stephen Rosasco
(74) *Attorney, Agent, or Firm* — Tung & Associates

(57) ABSTRACT

The present invention discloses a MEMS lithography mask with improved tungsten deposition topography and a method for making the same. The MEMS lithography mask includes: a pattern including at least two sections forming a conjunction with each other, each of the at least two sections having a width not less than a minimum width, the conjunction having a center and a plurality of corners, wherein at least one of the corners is inwardly recessed to reduce a width of the conjunction, the sections being for defining trenches on a substrate to be filled with tungsten as apart of a MEMS device, whereby the lowest height of the tungsten surface is not lower than 80% of the trench height.

11 Claims, 5 Drawing Sheets

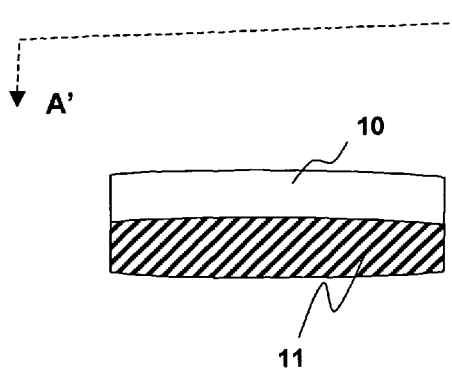
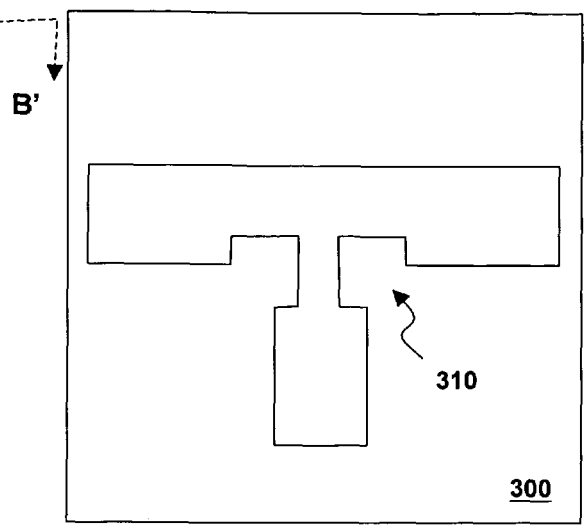
Fig. 4C        Fig. 5
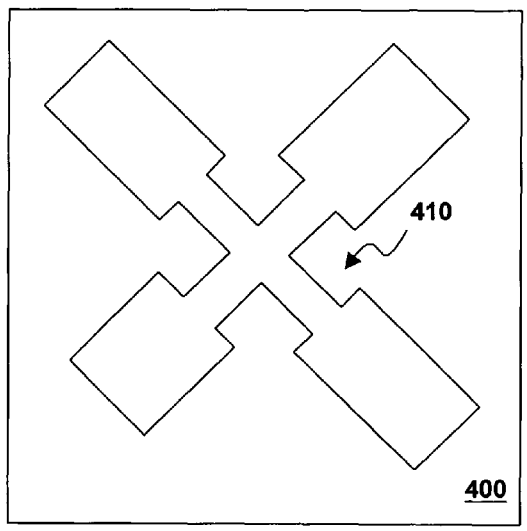
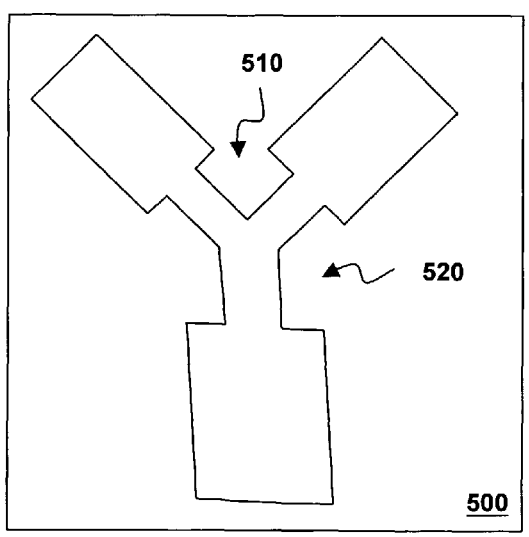
Fig. 6        Fig. 7

MEMS LITHOGRAPHY MASK WITH IMPROVED TUNGSTEN DEPOSITION TOPOGRAPHY AND METHOD FOR THE SAME

CROSS REFERENCE TO RELATED APPLICATIONS

This application claims priority to Taiwanese Patent Application No. 099109470, filed on Mar. 29, 2010.

BACKGROUND OF THE INVENTION

1. Field of Invention

The present invention is related to a micro-electro-mechanical-system (MEMS) lithography mask, in particular to one that improves tungsten deposition topography, and a method for improving tungsten deposition topography.

2. Description of Related Art

A MEMS typically contains, a MEMS device and a microelectronic circuit which need to be integrated with each other to constitute an integrated MEMS chip. Such integration is an important concern in the manufacturing process of a MEMS chip.

FIG. 1 shows a partial pattern 100 of a prior art MEMS lithography mask for defining a tungsten layer; what is shown is a partial pattern of the MEMS device, while the pattern of the microelectronic circuit is not shown. Tungsten is an important material often used for making plugs in the interconnection of a microelectronic circuit; a typical process for forming such tungsten plugs is damascene process. A damascene process includes steps as follows: first, etching trenches in a silicon dioxide layer according to a desired pattern; second, depositing tungsten in the trenches by, e.g., chemical vapor deposition; and last, polishing the surface by chemical mechanical polish to prepare for later deposition of metal wire layer. In the same time as the tungsten being deposited in the microelectronic circuit area, a tungsten layer is also formed in the MEMS device area. This tungsten layer in the MEMS device area is to constitute a mechanical structure, for example, to constitute a part of a MEMS device, such as a movable component, a fixed component, a spring, or an anchor, etc. in combination with an upper or lower metal layer.

Please refer to FIGS. 2, 2A and 2B, which show the 3-dimensional structure of the MEMS device. A movable electrode 30 (FIG. 2A) and fixed electrodes 40 (FIG. 2B) are formed on a substrate 20, wherein the fixed electrodes 40 are fixed to the substrate 20 by one or more structure layers 12 below. When the movable electrode 30 move in the direction shown in FIG. 2A, the gaps between the movable electrode 30 and the fixed electrodes 40 are changed so that the capacitance is changed accordingly; a displacement can thus be measured. In this example, the mask shown in FIG. 1 is used to define the structure of the aluminum layer 10 and the tungsten layer 11.

Referring back to FIG. 1, in the mask pattern 100 which defines the tungsten layer, often there are two or more sections forming a conjunction with each other. For example, in the cross-shaped pattern 110 at the left of FIG. 1, a conjunction is formed in the dotted circle. If the cross-shaped pattern 110 in FIG. 1 is used to define a trench for depositing tungsten, the topography as shown in FIG. 3A might be formed, and the cross-section view along the cross-section line AB would appear as shown in FIG. 3B. As one can see from FIG. 3B, the center of the conjunction is not fully filled with tungsten because it is far from the edges of the sections. Therefore, there is a cavity at the center of the conjunction. And if another metal layer 10, such as aluminum or copper layer, is deposited thereon, the metal layer will also follow the topography and form a smaller cavity at the center. Because the surface topography is not even, the stress between different metal layers increases accordingly, which may cause malfunctions in the MEMS such as due to errors in the relationships between the movable electrodes and fixed electrodes.

In the prior art mentioned above, the damascene process of tungsten generates cavities in the topography in the MEMS device area and may affect the functionality of the MEMS device; this is disadvantageous. In view of such drawback, the present invention proposes a MEMS lithography mask with improved tungsten deposition topography and a corresponding method to overcome it.

SUMMARY OF THE INVENTION

An objective of the present invention is to provide a MEMS lithography mask with improved tungsten deposition topography.

Another objective of the present invention is to provide a method for improving tungsten deposition topography in MEMS.

To achieve the foregoing objectives, in one perspective of the present invention, it provides a MEMS lithography mask with improved tungsten deposition topography, comprising: a pattern including at least two sections forming a conjunction with each other, each of the at least two sections having a width not less than a minimum width, the conjunction having a center and a plurality of corners, wherein at least one of the corners has an inwardly recessed portion to reduce a width of the conjunction, wherein the sections are for defining trenches on a substrate to be filled with tungsten as a part of a MEMS device and tungsten is filled to not lower than 80% of the trench height.

In the foregoing MEMS lithography mask, the inwardly recessed portion has a rectangle or polygon shape.

In the foregoing MEMS lithography mask, the pattern has at least one right angle or bevel angle.

In the foregoing MEMS lithography mask, the pattern is a cross-shaped, X-shaped, T-shaped, Y-shaped or λ-shaped pattern.

In another perspective of the present invention, it provides a method for improving tungsten deposition topography in MEMS, the method comprising: providing a mask with a pattern including at least two sections forming a conjunction with each other, each of the at least two sections having a width not less than a minimum width, the conjunction having a center and a plurality of corners, wherein at least one of the corners has an inwardly recessed portion to reduce a width of the conjunction; performing a lithography process on a substrate by the mask, and etching the substrate to form trenches with at least two sections forming a conjunction with each other; depositing tungsten in the trenches to the height not lower than 80% of the trench height; and forming a part of a MEMS device by a structure formed by the deposited tungsten.

The foregoing method may further comprise: polishing the deposited tungsten by chemical mechanical polishing technology.

The objectives, technical details, features, and effects of the present invention will be better understood with regard to the detailed description of the embodiments below, with reference to the drawings.

BRIEF DESCRIPTION OF THE DRAWINGS

FIG. 4C illustrates, by cross-section view, a schematic diagram along the cross-section line A'B' of FIG. 4B.

FIGS. 5-8 respectively show the second, third, fourth, and fifth embodiment of the present invention.

DESCRIPTION OF THE PREFERRED EMBODIMENTS

The drawings as referred to throughout the description of the present invention are for illustration only, to show the manufacturing process and the interrelations between the layers, but not drawn according to actual scale.

The concept of present invention is to modify the conjunction pattern of the MEMS mask to improve the topography of deposited tungsten, so that the surface is relatively more even and the function of the MEMS device is less affected.

Several embodiments will be described below to illustrate the above concept. Based on the spirit of these embodiments, a person having ordinary skill in the art can apply the concept to any other occasion where a tungsten layer is used to constitute a mechanical structure, for improving the tungsten deposition topography.

Figure 1:
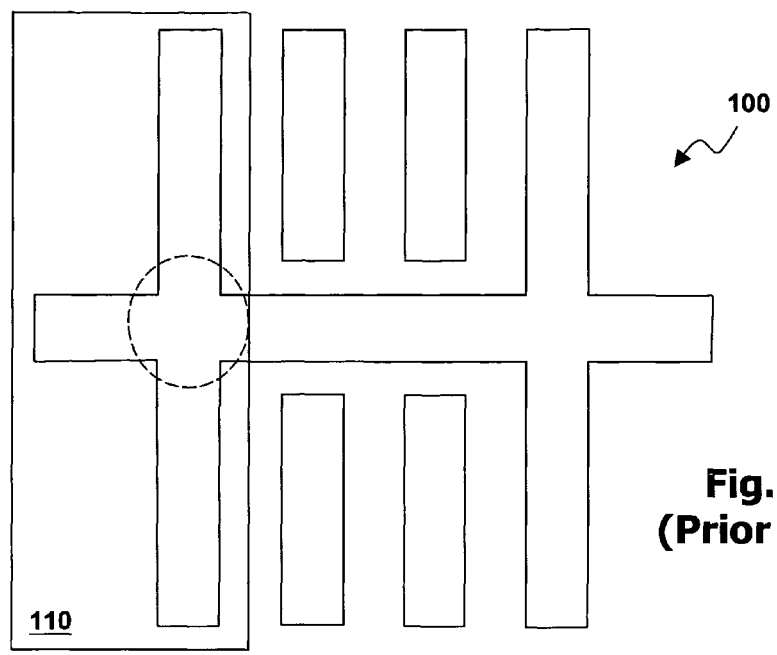
FIG. 1 shows a part of a prior art MEMS mask pattern.
Figure 2:
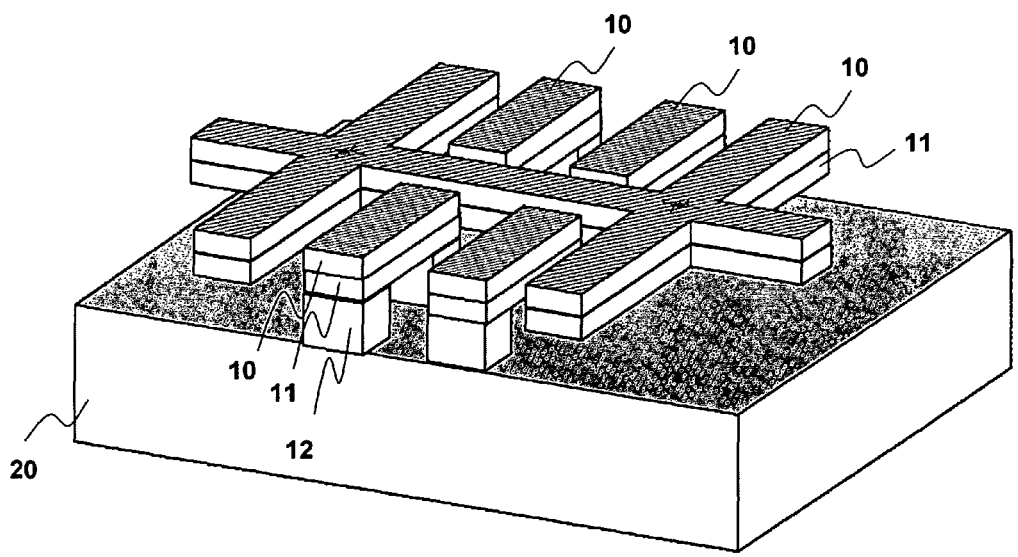
FIG. 2 shows a part of a prior art MEMS device on a substrate.
Figure 2A:
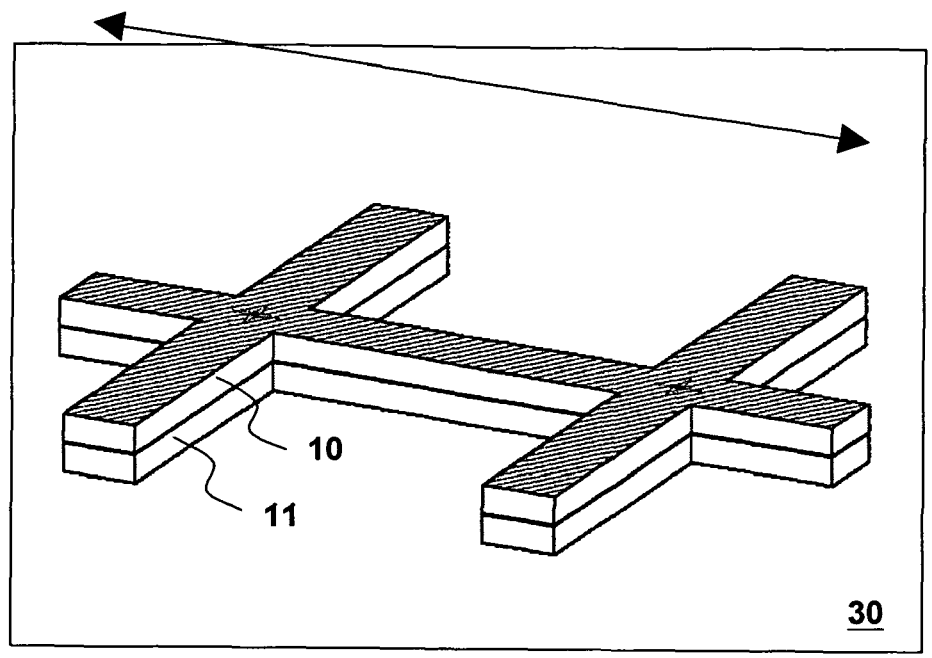
FIG. 2A shows the movable electrode in FIG. 2.
Figure 2B:
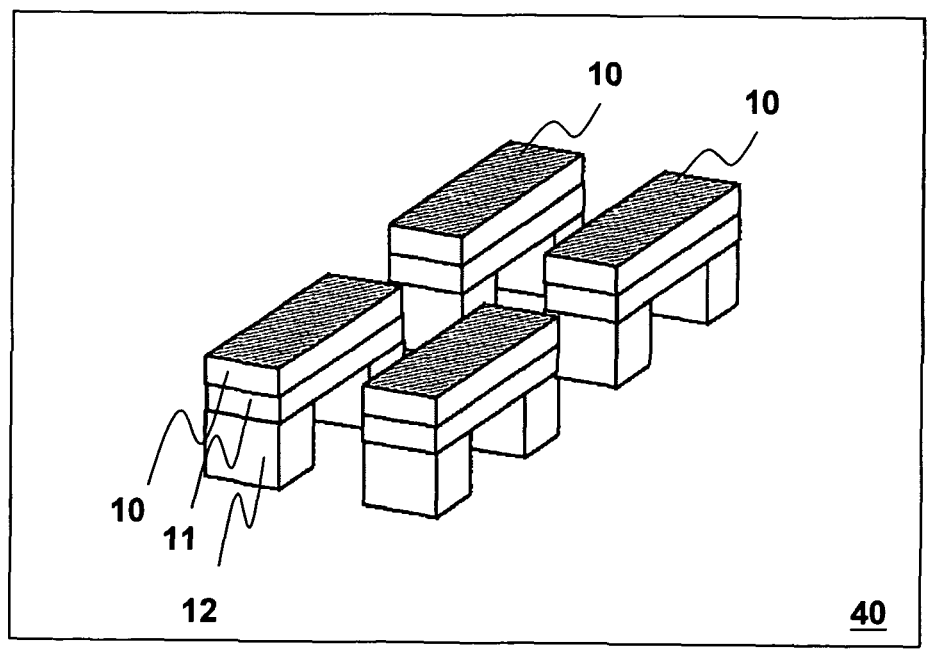
FIG. 2B shows the fixed electrodes in FIG. 2.
Figure 3A:
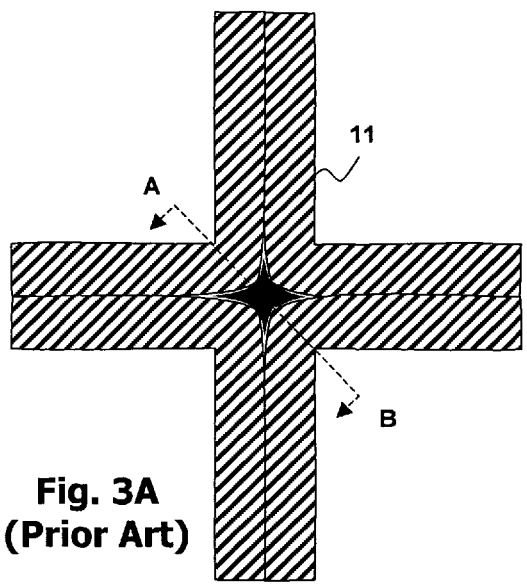
FIG. 3A illustrates, by top-view, a schematic diagram of the topography formed on the substrate in the prior art.
Figure 3B:
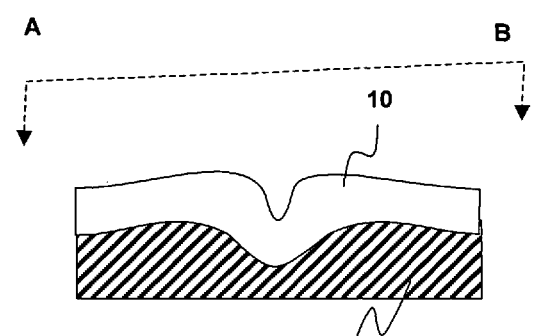
FIG. 3B illustrates, by cross-section view, a schematic diagram along the cross-section line AB of FIG. 3A.
Figure 4A:
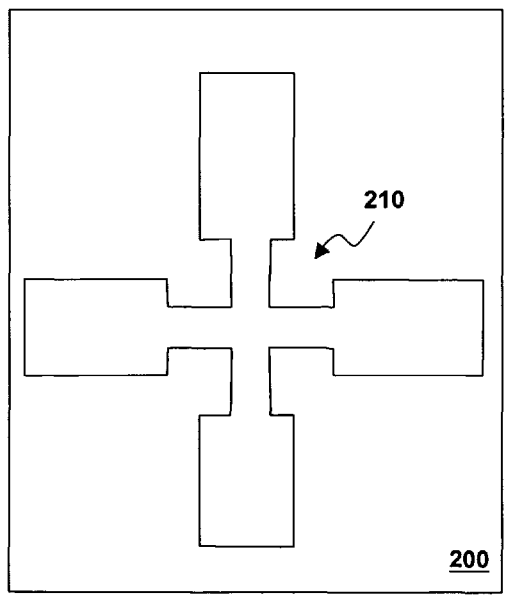
FIG. 4A shows a mask pattern according to the first embodiment of the present invention.
Figure 4B:
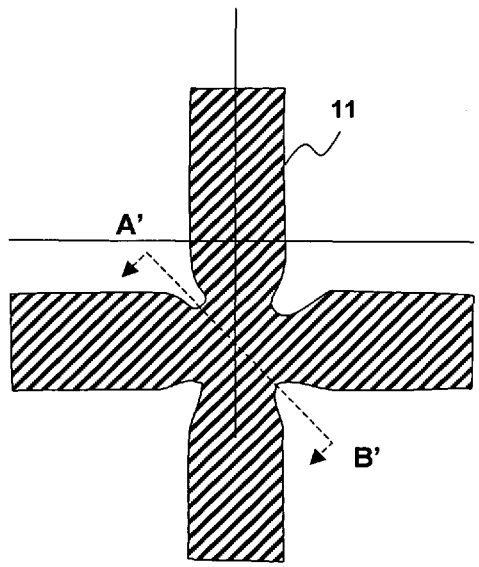
FIG. 4B illustrates a schematic diagram of the topography formed on the substrate by the mask of FIG. 4A.

FIG. 4A shows the first embodiment of this invention, where a mask pattern for forming a cross-shaped conjunction is shown as an example. In this embodiment, the mask contains a cross-shaped pattern 200, which is formed by two sections vertically intersecting each other. However, in the four corners of the conjunction, inwardly recessed rectangular portions 210 are provided to reduce the width of the conjunction. Using this mask, a lithography process can be performed on a substrate, and a following etch step forms trench topography with a conjunction. Next, tungsten is deposited in the trenches to form a part of MEMS device. The structure formed by the deposited tungsten is illustrated in FIG. 4B, and FIG. 4C is a schematic cross section diagram along the cross-section line A'B' of FIG. 4B. From FIGS. 4B-4C and referring to FIGS. 3A-3B, one can see that the cavity at the center of the conjunction no longer exists; the tungsten layer 11 and aluminum layer 10 have even topography. The prior art disadvantage resulting from the cavity in the topography of the deposited tungsten deposition, which causes malfunctions of the MEMS device, can be improved. According to present invention, the height of the deposited tungsten is related to the size of the inwardly recessed portion. In a preferred embodiment, the height of the deposited tungsten is preferably not lower than 80% of the trench height. After completion of tungsten deposition, chemical mechanical polishing technology could be applied to polish the deposited tungsten if it is required.

Figure 8:
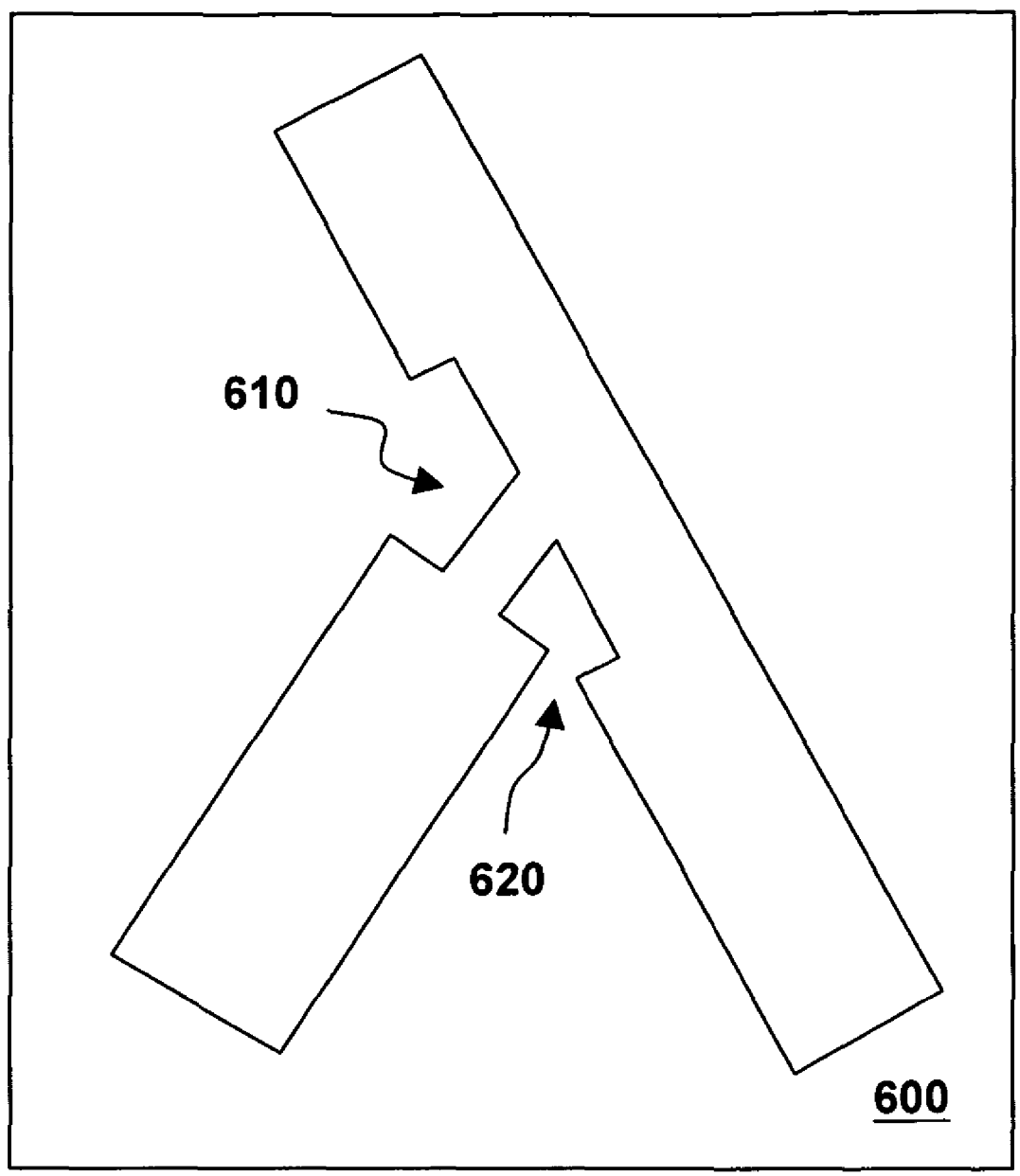

FIGS. 5-8 respectively show the second, third, fourth, and fifth embodiment of the present invention. FIG. 5 is a mask pattern 300 for forming a T-shaped conjunction pattern, in which the two corners are inwardly recessed by rectangular portions 310 to reduce the width of the conjunction. FIG. 6 shows a mask pattern 400 for forming an X-shaped conjunction pattern, in which the four corners are inwardly recessed by rectangular portions 410 to reduce the width of the conjunction. FIG. 7 shows a mask pattern 500 for forming a Y-shaped conjunction pattern, in which the three corners are inwardly recessed by one rectangular portion 510 and two polygonal portions 520 to reduce the width of the conjunction. FIG. 8 shows a mask pattern 600 for forming a λ-shaped conjunction pattern, in which the two corners are inwardly recessed by rectangular portions 610, 620 to reduce the width of the conjunction. As one can see from the above embodiments, the sections which form the conjunction may connect with or cross over each other by right angle or bevel angle. Certainly, the number of sections forming the conjunction is not limited to two.

The present invention has been described in considerable detail with reference to certain preferred embodiments thereof. It should be understood that the description is for illustrative purpose, not for limiting the scope of the present invention. Those skilled in this art can readily conceive variations and modifications within the spirit of the present invention. For example, for making a mask, it is easier for the inwardly recessed portion to have a rectangle or polygon shape. However, other shapes are also possible such as a circular shape, etc.; the present invention should not be limited thereby. As another example, the sections which form the conjunction are not limited to be straight lines, but can also be curve lines, trapezoidal lines (gradually thinner or gradually thicker), or a irregular shape, etc. In view of the foregoing, the spirit of the present invention should cover all such and other modifications and variations, which should be interpreted to fall within the scope of the following claims and their equivalents.

What is claimed is:

1. A MEMS lithography mask with improved tungsten deposition topography comprising:
 a pattern including at least two sections forming a conjunction with each other, each of the at least two sections having a width not less than a minimum width, the conjunction having a center and a plurality of corners, wherein at least one of the corners has an inwardly recessed portion to reduce a width of the conjunction, and wherein the sections are for defining trenches on a substrate to be filled with tungsten as a part of a MEMS device.

2. The MEMS lithography mask of claim 1, wherein the inwardly recessed portion has a rectangle or polygon shape.

3. The MEMS lithography mask with improved tungsten deposition topography of claim 1, wherein the pattern has at least one right angle or bevel angle.

4. The MEMS lithography mask with improved tungsten deposition topography of claim 1, wherein the pattern is a cross-shaped, X-shaped, T-shaped, Y-shaped or λ-shaped pattern.

5. The MEMS lithography mask with improved tungsten deposition topography of claim 1, wherein tungsten is filled to not lower than 80% of the trench height.

6. A method for improving tungsten deposition topography in MEMS comprising:
 providing a mask with a pattern including at least two sections forming a conjunction with each other, each of the at least two sections having a width not less than a minimum width, the conjunction having a center and a plurality of corners, wherein at least one of the corners has an inwardly recessed portion to reduce a width of the conjunction;
 performing a lithography process on a substrate by the mask, and etching the substrate to form trenches with at least two sections forming a conjunction with each other;
 depositing tungsten in the trenches; and forming a part of a MEMS device by a structure formed by the deposited tungsten.

7. The method of claim 6, further comprising: polishing the deposited tungsten by chemical mechanical polishing technology.

8. The method of claim 6, wherein the inwardly recessed portion has a rectangle or polygon shape.

9. The method of claim 6, wherein the pattern has at least one right angle or bevel angle.

10. The method of claim 6, wherein the pattern is a cross-shaped, X-shaped, T-shaped, Y-shaped or λ-shaped pattern.

11. The method of claim 6, wherein tungsten is filled to not lower than 80% of the trench height.

* * * * *